United States Patent [19]
Hall et al.

[11] Patent Number: 5,350,492
[45] Date of Patent: Sep. 27, 1994

[54] OXIDE REMOVAL METHOD FOR IMPROVEMENT OF SUBSEQUENTLY GROWN OXIDES

[75] Inventors: Steven C. Hall, Round Rock; Mark I. Gardner, Red Rock; Henry J. Fulford, Jr., Austin, all of Tex.

[73] Assignee: Advanced Micro Devices, Inc., Sunnyvale, Calif.

[21] Appl. No.: 947,314

[22] Filed: Sep. 18, 1992

[51] Int. Cl.⁵ .................. H01L 21/00; H01L 21/02; B44C 1/22; C03C 15/00
[52] U.S. Cl. ........................................ 156/657; 437/56
[58] Field of Search ............... 156/657; 437/56, 57, 437/58; 430/313

[56] References Cited

U.S. PATENT DOCUMENTS

| | | | |
|---|---|---|---|
| 4,472,240 | 9/1984 | Kameyama | 156/657 |
| 4,713,329 | 12/1987 | Fang et al. | 437/56 |

FOREIGN PATENT DOCUMENTS

| | | | |
|---|---|---|---|
| 0002055 | 8/1988 | Japan | 437/56 |
| 0072661 | 3/1990 | Japan | 437/56 |

OTHER PUBLICATIONS

Ghandhi, VLSI Fabrication Principles, Wiley & Sons, 1983, pp. 421–430.
Elliot, Integrated Circuit Fabrication Technology, 1989, McGraw-Hill, pp. 59–61, 398, 399.
Sze, VLSI Technology, McGraw-Hill, 1988, p. 197.

*Primary Examiner*—R. Bruce Breneman
*Assistant Examiner*—B. Everhart
*Attorney, Agent, or Firm*—Skjerven, Morrill, MacPherson, Franklin & Friel

[57] ABSTRACT

A method is disclosed for removing oxide from the surface of a semiconductor body having a thick oxide and an adjoining nitride-covered thin oxide, without subjecting the surface to significant over-etching and thus avoiding degredation of the surface of the semiconductor body. The thick oxide is first etched for a period of time so that a portion of the thick oxide remains, and has a thickness comparable to that of the thin oxide. The nitride covering the thin oxide is next removed without appreciably etching either the remaining portion of the thick oxide or the thin oxide. Finally, the thin oxide and the remaining portion of the thick oxide are removed, without appreciably over-etching the surface of the semiconductor body.

16 Claims, 3 Drawing Sheets

OXIDE REMOVAL METHOD FOR IMPROVEMENT OF SUBSEQUENTLY GROWN OXIDES

CROSS-REFERENCE TO RELATED APPLICATION

This patent document is related to copending, commonly assigned U.S. patent application Ser. No. 07/947,313, filed on even date herewith, which names Henry Jim Fulford, Jr. and Mark I. Gardner as inventors and is entitled "An Oxide Removal Method for Improvement of Subsequently Grown Oxides for a Twin-Tub CMOS Process", which application is incorporated herein by reference in its entirety.

BACKGROUND OF THE INVENTION

1. Field of the Invention

This invention relates to the fabrication of semiconductor devices, and more specifically, to the removal of oxides from the surface of a semiconductor substrate.

2. Description of Related Art

The importance of high quality oxides in the fabrication of semiconductor devices cannot be over-emphasized. Many broad categories of commercial devices, such as Electrically Erasable Programmable Read-Only Memories (EEPROMS), Dynamic Random Access Memories (DRAMs), and more recently, even high-speed basic logic functions, owe their commercialization to the reproducibility of high quality, very thin oxide layers.

FIGS. 1A, 1B, and 1C are cross sections of a portion of a CMOS structure which illustrate several steps in the removal of the N-well oxide grown during the drive-in of an N-well implant. FIG. 1A shows the structure immediately after the N-well oxidation. In this example N-well oxide 14 is nominally 2700Å thick, having been grown to this thickness by a previous high temperature drive-in step for diffusing and activating the N-well implant (not shown) to form N-well 22. This specific thickness of 2700Å also provides a useful layer thickness to devise alignment structures for certain lithographic equipment. Nitride 10 covers the P-well 20 to prevent the implantation of the n-type dopant into the P-well 20, as well as to prevent the growth of any subsequent oxide over the P-well 20 during the formation of oxide layer 14 over the N-well 22. Nitride layer 10 is typically 920Å thick.

The nitride layer 10 over the P-well 20 is next removed with a wet phosphoric acid strip. Because of the extremely high selectivity of phosphoric acid between nitride and oxide, very little oxide is removed during this etch step. Barrier oxide 12 covers the P-well 20 and provides an etch-stop barrier during this nitride removal process, as the phosphoric acid used to etch the nitride 10 would also etch the silicon substrate itself in the P-well 20. This barrier oxide 12 is approximately 400Å thick. The structure remaining after nitride 10 removal is shown in FIG. 1B. As very little oxide was removed by the nitride etch step, the nominal thickness of barrier oxide 12 is still 400Å, and the nominal thickness of N-well oxide 14 remains at 2700Å.

The next step is a 12 minute 10:1 HF dip etch which is required to remove the 2700Å of N-well oxide 14. The resulting structure following the HF dip etch is shown in FIG. 1C. Next, typically the surface is subject to an RCA clean, and a thin oxide is subsequently grown over the exposed surface of the semiconductor material. This thin oxide may be a tunnel oxide or a gate oxide, for example.

SUMMARY OF THE INVENTION

We have found that an over-etch of the silicon surface at any process step prior to the growth of a thin oxide severely damages a silicon surface, thereby degrading the integrity of any subsequently grown thin oxide. Therefore, process flows that include an over-etch prior to a thin oxide formation do not achieve yields as high as might otherwise be achieved.

The present invention advantageously avoids excessively over-etching surface portions of a semiconductor body in the removal by etching of dielectrics of different thicknesses from these surface portions. The avoidance of over-etching facilitates the making of high quality thin oxides for numerous semiconductor fabrication purposes, including the making of tunnel oxides in the fabrication of EEPROM devices.

This advantage and other advantages are achieved in the present invention, which involves converting a thick dielectric into a dielectric of thickness comparable to a thin dielectric. As the converting step involves etching, a protective material is provided over the thin dielectric. Once the converting step is complete, the protective material is removed, and both the thin dielectric and converted dielectric are etched without appreciably over-etching the underlying semiconductor surfaces. In one embodiment, the converting step involves etching the thick dielectric, which is an oxide formed during a drive-in fabrication step, down to a thickness comparable to the thickness of the thin dielectric, which is a barrier oxide provided between a nitride layer and the silicon substrate. The nitride layer also acts as the protective material.

DETAILED DESCRIPTION OF THE PREFERRED EMBODIMENTS

Figure 1A:
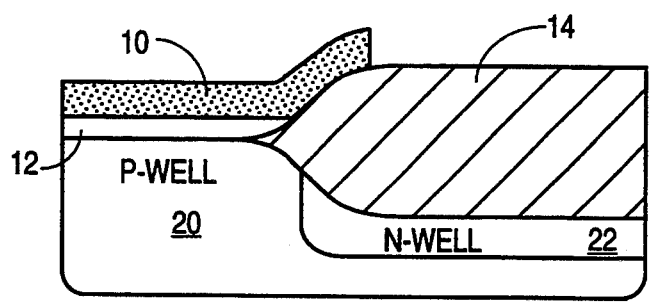
FIGS. 1A, 1B, and 1C are cross-sectional views illustrating a prior-art process flow for removing oxides of different thickness in a CMOS process.
Figure 1B:
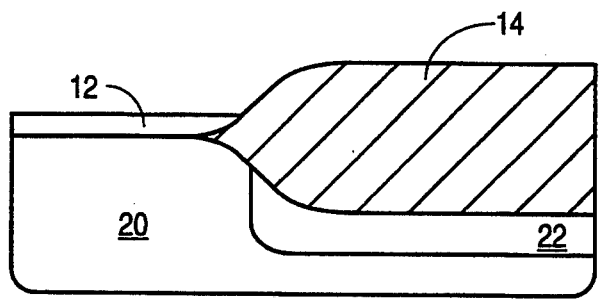
Figure 1C:
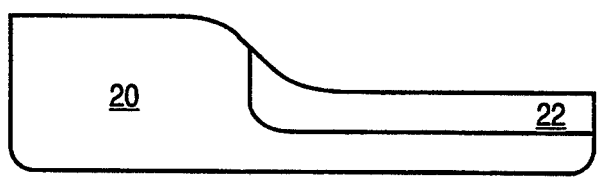

Referring to the oxide removal method illustrated by the cross-sections of FIGS. 1A, 1B, and 1C, since the etch rate of silicon dioxide in 10:1 HF is nominally 325Å/minute, the 2700Å thick N-well oxide 14 requires a 12 minute etch (which allows for manufacturing variations in exact thickness and etch rates). Since the barrier oxide 12 is only 400Å thick, the silicon substrate over the P-well 20 unfortunately receives an over-etch of 10.75 minutes, representing an over-etch of 860%. We have found that a prolonged over-etch of the silicon surface at any process step prior to the growth of a thin oxide severely damages a silicon surface, thereby degrading the integrity of any subsequently grown thin oxide.

Figure 2:
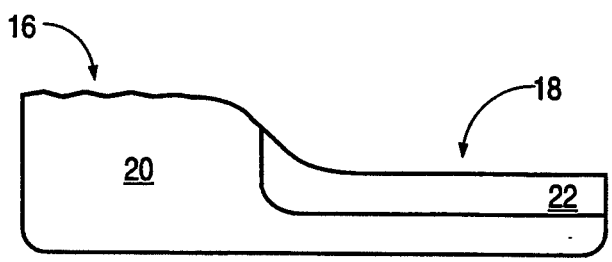
FIG. 2 is a cross-sectional view illustrating the actual surface resulting from the oxide etch step of the structure shown in FIG. 1B.

FIG. 2 shows the surfaces 16 (over the P-well 20) and 18 (over the N-well 22) actually resulting from the oxide etch of the structure shown in FIG. 1B. P-well surface 16 shows micro-roughness, due to the tremendous over-etch experienced by this surface 16. In contrast, N-well surface 18 is free from significant over-etch effects, since the etch was timed for complete removal of the N-well oxide 14, with only the customary nominal over-etch (to assure complete removal of the N-well oxide 14).

Excess time in an HF etch increases the micro-roughness and allows the P-well surface 16 to attract more particles and heavy metals. In subsequent process steps, thin gate oxides are grown from the P-well surface 16 to form N-channel transistors (not shown) and, for some product types, to form tunneling oxides (not shown) between N-type implanted regions (not shown) and a polysilicon layer (not shown). The presence of contaminant particles and heavy metals can cause defects in these oxide layers, which adversely affect the manufacturing yields.

Figure 3A:
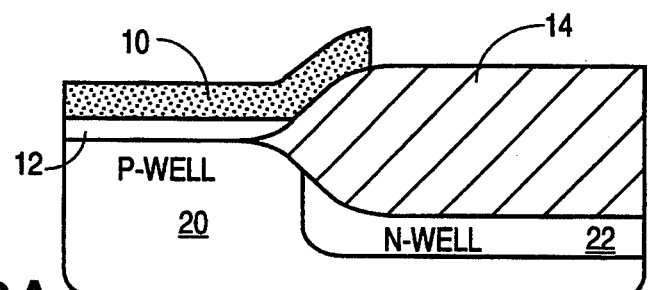
FIGS. 3A, 3B, 3C, and 3D are cross-sectional views illustrating a process flow, in accordance with the present invention, for removing oxides of different thickness in a CMOS process.
Figure 3B:
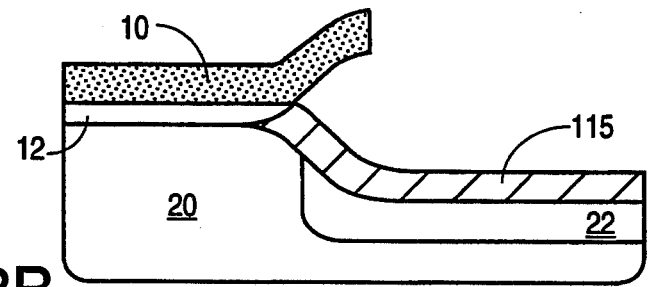
Figure 3C:
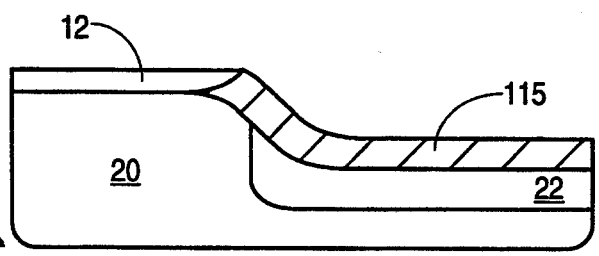
Figure 3D:
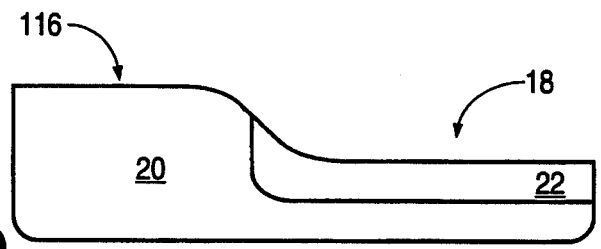

FIGS. 3A to 3D are cross-sections of a portion of a CMOS structure at various steps in a process which reduces substantially the amount of over-etch of the P-well surface, thereby improving the quality of subsequently grown thin oxides. The practical implication of the process used to form the structures of FIGS. 3B to 3D is the improvement of manufacturing yields and product quality.

FIG. 3A, which is identical to FIG. 1A, shows in cross-section a portion of a device structure immediately after N-well oxidation. N-well oxide 14 is nominally 2700Å thick, having been grown to this thickness by a previous high temperature drive-in step for diffusing and activating the N-well implant (not shown) to form N-well 22. Nitride 10 covers the P-well 20 to prevent the implantation of the n-type dopant into the P-well 20, as well as to prevent the growth of any subsequent oxide over the P-well 20 during the N-well oxidation. Nitride layer 10 is typically 920Å thick.

Rather than next removing the nitride layer 10 as shown in FIG. 1B, only a portion of the N-well oxide 14 is now removed. This is accomplished by a 6 minute 10:1 HF dip etch that removes approximately 2000Å of the N-well oxide 14. The resulting structure is shown in FIG. 3B. The remaining N-well oxide 115 is approximately 700Å thick.

Next, the nitride layer 10 over the P-well 20 is removed with a wet phosphoric acid strip. Barrier oxide 12 covers the P-well 20, and remaining N-well oxide 115 covers the N-well 22, as both provide an etch stop during the nitride removal. Because of the extremely high selectivity of phosphoric acid between nitride and oxide, very little oxide is removed during this etch step. The resulting structure remaining after nitride removal is shown in FIG. 3C. The nominal thickness of barrier oxide 12 is still 400Å, and the nominal thickness of remaining N-well oxide 115 is 700Å.

Lastly, a 3 minute 10:1 HF dip is performed to remove the barrier oxide 12 and the remaining N-well oxide 115. Since the thicknesses of the two oxides are comparable, an etch step sufficient to remove the thicker oxide will not subject the surface beneath the thinner oxide to substantial over-etching. The barrier oxide 12 is subjected to a total etch time of 3 minutes, rather than 12 minutes as in the process of FIGS. 1A to 1C, which reduces the over-etch from 860% to only 144%. Naturally, the over-etch time can be further reduced by reducing the thickness of remaining N-well oxide 115 to be closer to, or even less than, the thickness of barrier oxide 12.

FIG. 3D shows the resulting structure remaining after the above mentioned oxide etch step. P-well surface 116 shows much less micro-roughness, due to the significantly reduced amount of over-etch experienced by this surface. The structure shown in FIG. 3D typically is subject to an RCA clean prior to subsequent oxide growth. If care is taken, the RCA clean will not appreciably damage the P-well surface 116 and N-well surface 18. Suitable RCA clean techniques are described in "Dependence of Thin Oxide Quality on Surface Micro-Roughness" by T. Ohmi, et. al., IEEE Transactions on Electron Devices, Vol. 39, Number 3, March 1992.

Generally, in structures having oxides of different thickness over substrate regions in which gate or tunnel oxides are to be formed, the thicker oxides are converted to oxides having thickness comparable to the thickness of the thin oxide. Preferably, none of these surface regions is subject to greater than about a two minute over-etch time. In the process of FIG. 3, since barrier oxide 12 typically is in the range of 150–500Å thick and N-well oxide 14 typically is as thick as 6000Å, conversion of the oxide 14 to an oxide 115 of, for example, less than about 1000Å allows for a suitably limited over-etch in the subsequent oxide etch step.

To evaluate the effects on oxide quality of subsequently grown oxides over the P-well, as well as to determine if other parameters experienced degradation, devices were fabricated utilizing both the process flow of FIGS. 1A to 1C and the process flow of FIGS. 3A to 3D. Tunnel oxides for, illustratively, an EEPROM technology were grown to provide a sub-100Å oxide for oxide quality measurements. Quality improvements achieved for this type of oxide can be equally applied to a wide variety of semiconductor devices. Silicon-gate transistors were also fabricated in both the N-well and the P-well to ascertain any effects upon device characteristics.

To determine the effects of the process flow of FIGS. 3A to 3D on the quality of oxides grown from the P-well surface, both edge QBD and surface QBD measurements were made on structures using a tunnel oxide. QBD ("charge-to-breakdown") is a measure of the time-dependent breakdown characteristic of an oxide layer. It is measured by passing a constant current through the oxide under test (which conducts via Fowler-Nordheim tunneling), and noting the time at which the oxide breaks down electrically. Breakdown occurs due to the trapping of charge within the oxide, thereby gradually raising the electric field across the oxide until the oxide can no longer withstand the induced voltage. Higher quality oxides will trap less charge over time, and will therefore take longer to break down. The mathematical product of the forcing current times the measured time to breakdown gives rise to a charge value corresponding to the total charge passed through the oxide prior to breakdown. Higher QBD values reflect higher quality oxides.

Figure 4:
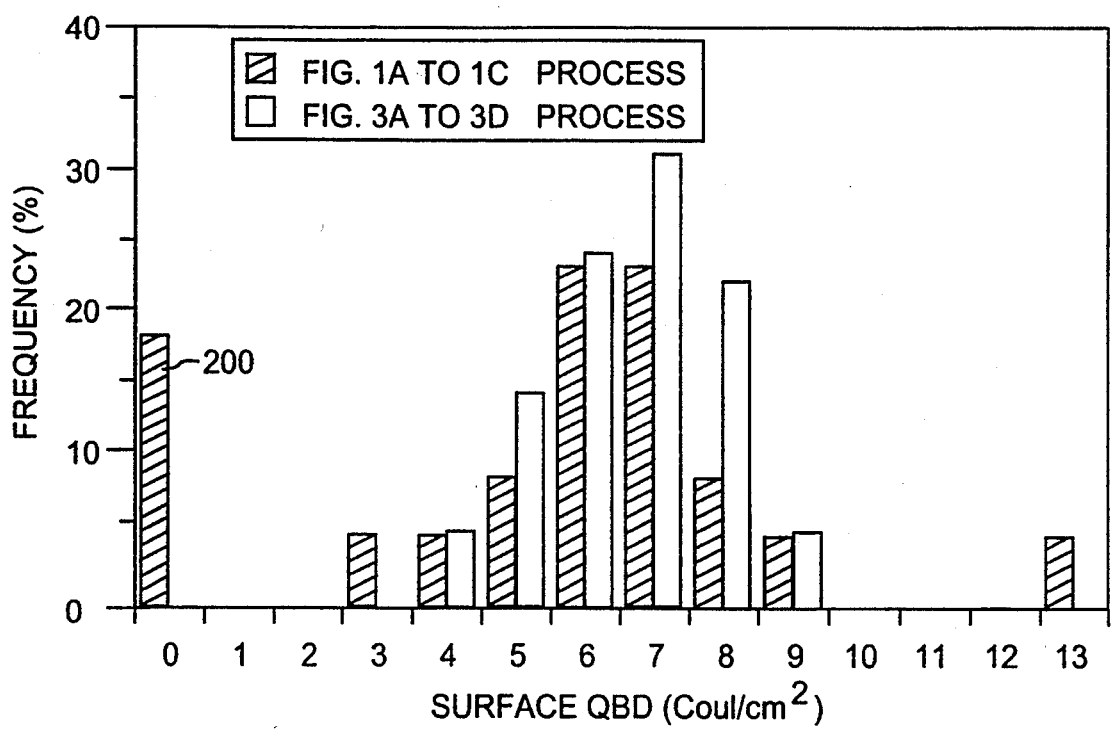
FIG. 4 is a histogram of Edge QBD measurements for the structures resulting from the process flows of FIGS. 1A, 1B and 1C and FIGS. 3A, 3B, 3C and 3D.

FIG. 4 shows a histogram of measurements for the Edge QBD structure, for both the process flow of FIGS. 1A to 1C and the process flow of FIGS. 3A to 3D. Of significance at first glance is that 16% of the wafers from the process flow of FIGS. 1A to 1C (bar 200) produced a zero value for this test, indicating an initial electrical short in the oxide layer with minimal applied voltage. The group of wafers from the process flow of FIGS. 3A to 3D had no shorted wafers. Furthermore, the mean value of edge QBD improves from 3.15 to 3.73 coul/cm**2, for a 20% improvement. The sigma of the distributions was also enhanced by a factor of 3.5, representing much better uniformity of the grown oxides.

Figure 5:
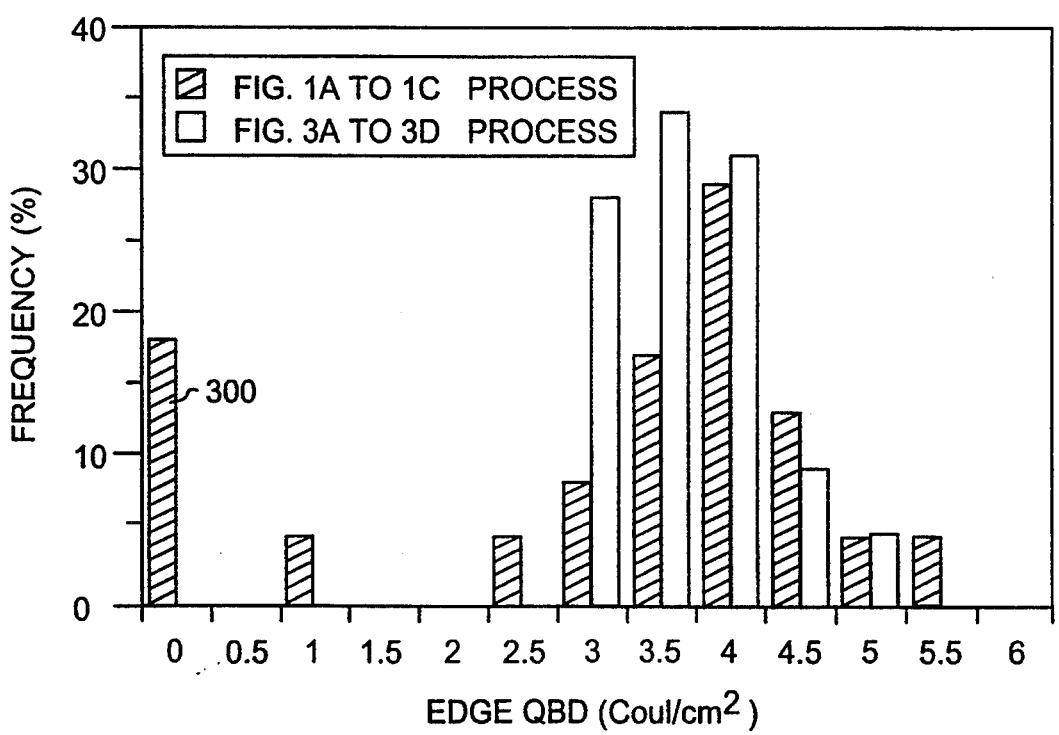
FIG. 5 is a histogram of Surface QBD measurements for the structures resulting from the process flows of FIGS. 1A, 1B and 1C and FIGS. 3A, 3B, 3C and 3D.

Referring to FIG. 5, an analysis of the surface QBD structure revealed a total elimination of all shorted wafer failures (bar 300) when using the process flow of FIGS. 3A to 3D. Additionally, a substantial reduction in the surface QBD distribution was observed (FIG. 3 process flow sigma=1.27 coul/cm2, versus FIG. 1 process flow sigma=3.08 coul/cm2).

These improvements represent a startling cost reduction in the production of devices using thin oxides. The process flow of FIGS. 3A to 3D yields a higher quality oxide, at lower cost, while producing no known unwanted side effects in N-channel and P-channel transistor characteristics.

While the above descriptions reference an EEPROM technology fabricated in a single-tub CMOS technology, the teachings of this disclosure can be advantageously applied to other semiconductor process technologies, particularly processes derived from early LOCOS technology which uses nitride layers to selectively mask oxidation. For example, a twin-tub CMOS technology having an oxide removal method for improvement of subsequently grown oxides is described in the previously referenced application of Fulford et al.

While the invention has been described with respect to the embodiments set forth above, the invention is not necessarily limited to these embodiments. For example, the invention is not necessarily limited to any particular transistor process technology, or to any particular layer thickness or composition. Moreover, variations in certain of the process steps can be practiced. For example, rather than stopping the etching of the thick N-well oxide 14 to achieve the remaining N-well oxide feature 115, conversion of the thick N-well oxide 14 may be achieved by removing the oxide 14 entirely and growing a new oxide to the thickness of the N-well oxide feature 115. Accordingly, other embodiments, variations, and improvements not described herein are not necessarily excluded from the scope of the invention, which is defined by the following claims.

We claim:

1. A method for removing a dielectric from the surface of a semiconductor body, wherein the dielectric comprises a first dielectric and a second dielectric in respective first and second regions of the semiconductor body, and wherein the second dielectric is thicker than the first dielectric, comprising the steps of:
   providing a protective layer covering the first dielectric, the protective layer comprising a material not highly reactive to a dielectric etchant;
   converting with use of the dielectric etchant the second dielectric into a third dielectric having a thickness comparable to the thickness of the first dielectric, wherein the protective layer masks the first dielectric from the dielectric etchant;
   subsequent to the dielectric converting step, removing the protective layer; and
   subsequent to the protective layer removing step, commonly etching the first and third dielectrics down to respective first and second surfaces of the semiconductor body, wherein neither the first surface nor the second surface is appreciably degraded due to over-etching.

2. A method as in claim 1 wherein the dielectric comprises an oxide.

3. A method as in claim 2 wherein the protective layer comprises a nitride layer.

4. A method as in claim 1 wherein the dielectric converting step comprises forming the third dielectric by etching the second dielectric so that a portion remains of a thickness comparable to the thickness of the first dielectric.

5. A method as in claim 1 wherein the dielectric converting step comprises forming the third dielectric by removing the second dielectric and then regrowing an oxide over the second region to a thickness comparable to the thickness of the first dielectric.

6. A method for removing oxide from the surface of a semiconductor body having a thick oxide and an adjoining nitride-covered thin oxide prior to forming a gate oxide for a field effect device, comprising the steps of:
   etching the thick oxide so that a portion of the thick oxide remains, and has a thickness comparable to that of the thin oxide;
   subsequent to the thick oxide etching step, removing the nitride covering the thin oxide; and
   subsequent to the nitride removing step, etching the thin oxide and the remaining portion of the thick oxide without appreciably over-etching the surface of the semiconductor body.

7. A method as in claim 6 wherein the thick oxide covers an N-well region, the N-well region having been formed prior to the formation of the thick oxide.

8. A method as in claim 7 wherein the thickness of the thick oxide, prior to the thick oxide etching step, is nominally 2700Å.

9. A method as in claim 8 wherein the thickness of the thin oxide is nominally 400Å, and wherein the thickness of the remaining portion of the thick oxide is nominally 700Å.

10. A method as in claim 9 wherein the thick oxide etching step comprises etching the thick oxide for 6 minutes using 10:1 HF, and wherein the step of etching the thin oxide and the remaining portion of the thick oxide comprises etching both the thin oxide and the remaining portion of the thick oxide for 3 minutes using 10:1 HF.

11. A method for avoiding degradation of a surface of a semiconductor body having a thick oxide layer and an adjoining nitride-masked first thin oxide layer, comprising the steps of:
   converting the thick oxide into a second thin oxide;
   removing the nitride layer subsequent to the thick oxide converting step; and
   etching the first and second thin oxides subsequent to the nitride removing step, wherein the thickness of the first and second thin oxides and the duration of etching are such that appreciable degradation of the surface of the semiconductor body does not occur.

12. A method as in claim 11 wherein the converting step comprises forming the second thin oxide by etching the thick oxide so that a portion of the thick oxide remains.

13. A method as in claim 11 wherein the converting step comprises forming the second thin oxide by etching the thick oxide and then regrowing an oxide.

14. A method for avoiding degredation of a surface of a semiconductor body having a thick oxide layer and an adjoining nitride-masked first thin oxide layer, comprising the steps of:
   converting the thick oxide into a second thin oxide;
   removing the nitride layer subsequent to the thick oxide converting step; and
   etching the first and second thin oxides subsequent to the nitride removing step, wherein the thickness of the first and second thin oxides and the duration of etching are such that the surface of the semiconductor body remains free of appreciable surface micro-roughness.

15. A method as in claim 14 wherein the converting step comprises forming the second thin oxide by etching the thick oxide so that a portion of the thick oxide remains.

16. A method as in claim 14 wherein the converting step comprises forming the second thin oxide by etching the thick oxide and then regrowing an oxide.

* * * * *